(12) United States Patent
Chapman et al.

(10) Patent No.: US 7,209,498 B1
(45) Date of Patent: *Apr. 24, 2007

(54) METHOD AND APPARATUS FOR TUNING A LASER

(75) Inventors: William B. Chapman, Sunnyvale, CA (US); Timothy Day, San Jose, CA (US); John Pease, Santa Clara, CA (US); Paul Zorbedian, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 203 days.

This patent is subject to a terminal disclaimer.

(21) Appl. No.: 09/848,914

(22) Filed: May 4, 2001

(Under 37 CFR 1.47)

Related U.S. Application Data

(60) Provisional application No. 60/201,819, filed on May 4, 2000, and provisional application No. 60/276,758, filed on Mar. 16, 2001.

(51) Int. Cl.
*H01S 3/10* (2006.01)

(52) U.S. Cl. .......................................... 372/20; 372/26
(58) Field of Classification Search .................. 372/9, 372/10, 20, 26, 28, 31, 29.014, 29.022, 108, 372/11, 12, 21, 22, 23, 29.01, 29.011, 50
See application file for complete search history.

(56) References Cited

U.S. PATENT DOCUMENTS

| | | | |
|---|---|---|---|
| 3,676,799 A | * | 7/1972 | Danielmeyer ................ 372/32 |
| 3,967,211 A | | 6/1976 | Itzkan et al. |
| 4,309,671 A | | 1/1982 | Malyon |
| 4,504,950 A | | 3/1985 | AuYeung |
| 4,560,246 A | | 12/1985 | Cotter ...................... 350/96.16 |
| 4,583,227 A | | 4/1986 | Kirkby |
| 4,770,047 A | | 9/1988 | Arditty et al. |
| 4,839,614 A | | 6/1989 | Hill et al. |
| 4,843,233 A | | 6/1989 | Jeunhomme |
| 4,870,269 A | | 9/1989 | Jeunhomme et al. |
| 4,932,782 A | | 6/1990 | Graindorge et al. |
| 4,994,677 A | | 2/1991 | Graindorge |
| 5,028,395 A | | 7/1991 | Sebille et al. |
| 5,050,179 A | | 9/1991 | Mooradian |
| 5,058,124 A | | 10/1991 | Cameron et al. |
| 5,103,457 A | | 4/1992 | Wallace et al. |
| 5,115,677 A | | 5/1992 | Martin et al. |
| 5,141,316 A | | 8/1992 | Lefevre et al. |
| 5,172,185 A | | 12/1992 | Leuchs et al. |
| 5,181,078 A | | 1/1993 | Lefevre et al. |
| 5,185,643 A | | 2/1993 | Vry et al. |
| 5,218,610 A | | 6/1993 | Dixon |

(Continued)

FOREIGN PATENT DOCUMENTS

| EP | 0924628 | 6/1999 |
|---|---|---|
| WO | WO98/44424 | 10/1998 |

OTHER PUBLICATIONS

PCT International Search Report, Jun. 10, 2002.
Zhang, et al., "An Interference Filter Based External Cavity Laser For Dense Wavelength Division Multiplexing Applications", Corning OCA Corporation, pp. 1–6.

(Continued)

*Primary Examiner*—Armando Rodriguez
(74) *Attorney, Agent, or Firm*—Blakely, Sokoloff, Taylor & Zafman LLP

(57) ABSTRACT

The present invention provides a tunable laser with a compact form factor and precise tuning to any selected center wavelength of a selected wavelength grid. A novel tuning technique is disclosed which includes tuning the laser to selected passbands, as well as tuning the optical path length of the laser utilizing a variety of tuning elements and a feedback circuit working together.

24 Claims, 8 Drawing Sheets

U.S. PATENT DOCUMENTS

| | | |
|---|---|---|
| 5,225,930 A | 7/1993 | Land et al. |
| 5,270,791 A | 12/1993 | Lefevre et al. |
| 5,305,330 A | 4/1994 | Rieder et al. |
| 5,319,668 A | 6/1994 | Luecke |
| 5,321,717 A | 6/1994 | Adachi et al. |
| 5,327,447 A | 7/1994 | Mooradian |
| 5,331,651 A | 7/1994 | Becker et al. |
| 5,347,527 A | 9/1994 | Favre et al. |
| 5,349,440 A | 9/1994 | DeGroot |
| 5,373,515 A | 12/1994 | Wakabayashi et al. |
| 5,387,974 A | 2/1995 | Nakatani |
| 5,412,474 A | 5/1995 | Reasenberg et al. |
| 5,420,687 A | 5/1995 | Kachanov |
| 5,428,700 A | 6/1995 | Hall |
| 5,438,579 A | 8/1995 | Eda et al. |
| 5,450,202 A | 9/1995 | Tisue |
| 5,473,625 A | 12/1995 | Hansen et al. ............... 372/96 |
| 5,543,916 A | 8/1996 | Kachanov |
| 5,552,926 A * | 9/1996 | Owa et al. ................. 359/326 |
| 5,583,638 A | 12/1996 | Cutler |
| 5,594,744 A | 1/1997 | Lefevre et al. |
| 5,606,439 A | 2/1997 | Wu |
| 5,631,736 A | 5/1997 | Thiel et al. |
| 5,712,704 A | 1/1998 | Martin et al. |
| 5,719,674 A | 2/1998 | Martin et al. |
| 5,737,109 A * | 4/1998 | Goodwin .................... 398/197 |
| 5,760,391 A | 6/1998 | Narendran |
| 5,798,859 A * | 8/1998 | Colbourne et al. ......... 359/247 |
| 5,802,085 A | 9/1998 | Lefevre et al. |
| 5,825,792 A | 10/1998 | Villeneuve et al. |
| 5,886,785 A | 3/1999 | Lefevre et al. |
| 5,946,331 A | 8/1999 | Amersfoort et al. |
| 5,991,061 A | 11/1999 | Adams et al. .............. 359/188 |
| 6,043,883 A | 3/2000 | Leckel et al. |
| 6,061,369 A | 5/2000 | Conradi |
| 6,084,695 A | 7/2000 | Martin et al. |
| 6,108,355 A * | 8/2000 | Zorabedian .................. 372/20 |
| 6,115,401 A | 9/2000 | Scobey et al. |
| RE37,044 E | 2/2001 | Wu |
| 6,192,058 B1 | 2/2001 | Abeles |
| 6,205,159 B1 | 3/2001 | Sesko et al. ................. 372/20 |
| 6,243,517 B1 | 6/2001 | Deacon |
| 6,246,480 B1 | 6/2001 | O'Brien |
| 6,249,364 B1 | 6/2001 | Martin et al. |
| 6,252,718 B1 | 6/2001 | Lefevre |
| 6,282,215 B1 | 8/2001 | Zorabedian et al. |
| 6,304,586 B1 | 10/2001 | Pease et al. |
| 6,321,011 B2 | 11/2001 | Deacon |
| 6,324,204 B1 | 11/2001 | Deacon |
| 6,330,253 B1 | 12/2001 | Tuganov et al. |
| 6,331,892 B1 | 12/2001 | Green |
| 6,661,814 B1 * | 12/2003 | Chapman et al. ............... 372/6 |
| 2002/0041611 A1 * | 4/2002 | May ........................ 372/29.02 |
| 2002/0126345 A1 * | 9/2002 | Green et al. ................. 359/122 |

OTHER PUBLICATIONS

Takashashi, H., "Temperature Stability of Thin–Film Narrow–Bandpass Filters Produced by Ion–Assisted Deposition", Applied Optics, vol. 34, No. 4, pp. 667–675, Feb. 1, 1995, Supplied by the British Library–"the worlds knowledge" www.bl.uk.

Mellis et al., "Miniature Packaged External–Cavity Semiconductor Laser with 50 GHz Continuous Electrical Tuning Range", Electronics Letters vol. 24 No. 16, pp. 988–989, Apr. 22, 1988, Supplied by the British Library–"the worlds knowledge" www.bl.uk.

Scobey & Stupik, "Stable Ultra–Narrow Bandpass Filters", SPIE, vol. 2262, pp. 37–46. Supplied by the British Library–"the worlds knowledge" www.bl.uk.

Rosenberg, K.P., et al., "Logarithmically Variable Infrared Etalon Filters", SPIE vol. 2262, pp. 223–232, Supplied by the British Library–"the worlds knowledge" www.bl.uk.

Favre, et al., "External–Cavity Semiconductor Laser With 15nm Continous Tuning Range", Electronics Letters, vol. 22, No. 15, pp. 795–796, Jun. 17, 1996, Supplied by the British Library–"the worlds knowledge" www.bl.uk.

Macleod, H.A., "Thin Film Optical Filters", 2nd Edition, McGraw–Hill, 1989, pp. 244–269, Supplied by the British Library–"the worlds knowledge" www.bl.uk.

* cited by examiner

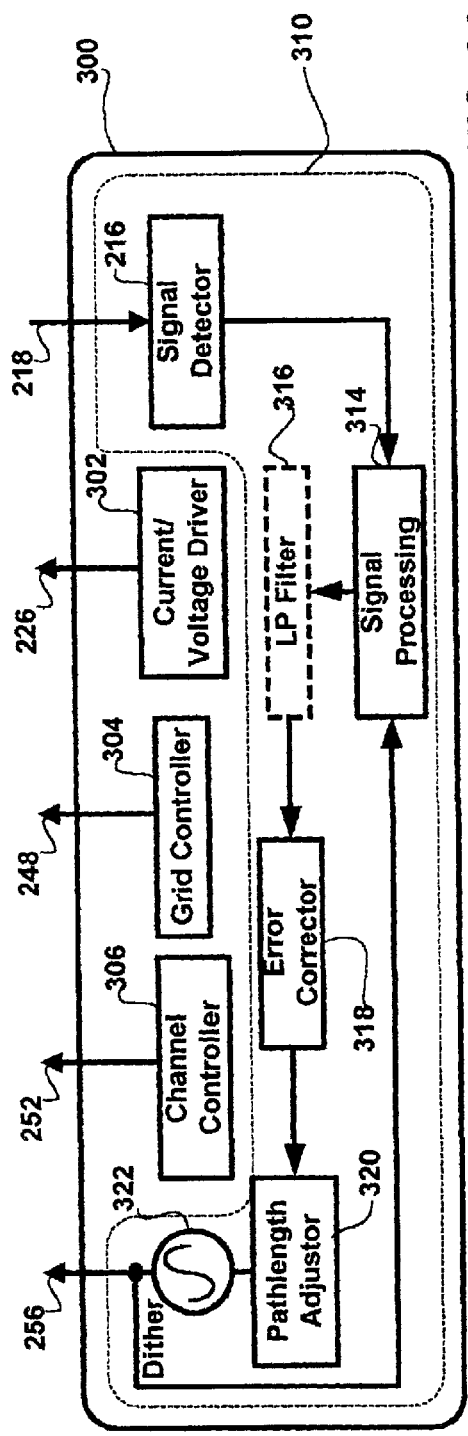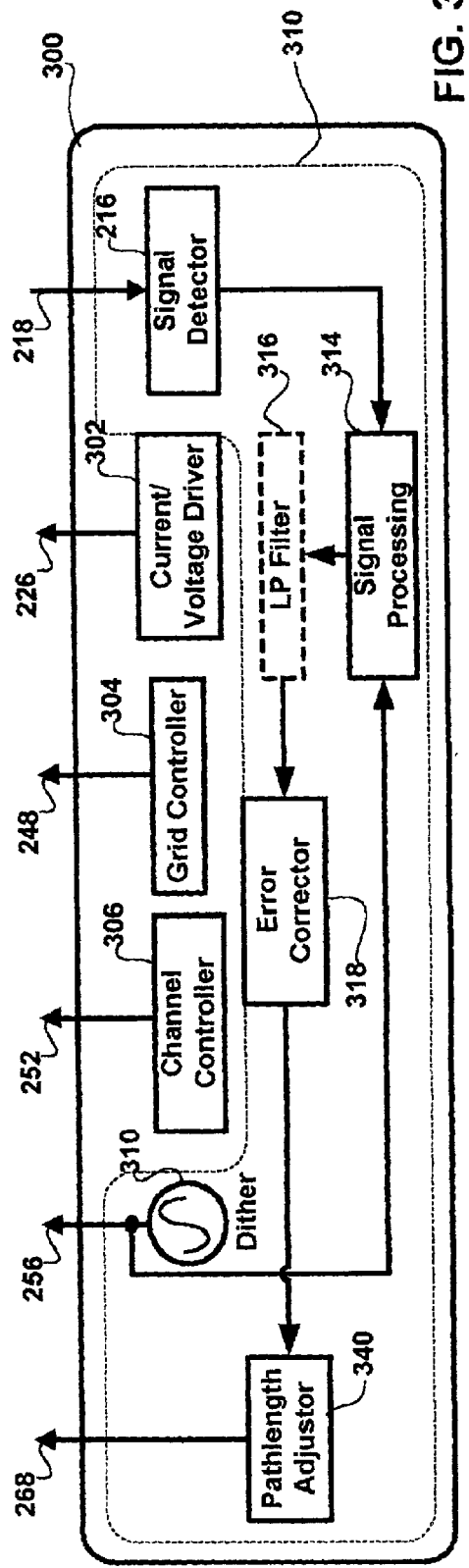

METHOD AND APPARATUS FOR TUNING A LASER

CROSS REFERENCE TO RELATED APPLICATIONS

This application claims the benefit of prior filed U.S. Provisional Application 60/201,819 filed on May 4, 2000 entitled "TUNABLE ECL SOURCE WITH ACTIVE WAVELENGTH STABILIZATION AND COHERENCE CONTROL" and 60/276,758 filed on Mar. 16, 2001 entitled "CLOSED LOOP TUNING SYSTEM WITH SBS REDUCTION" by inventors William B. Chapman et al., which application is incorporated herein by reference in its entirety.

BACKGROUND OF THE INVENTION

1. Field of Invention

The invention pertains to wavelength-agile laser transmitters. More particularly, the invention pertains to tunable lasers that may include internal wavelength referencing that can be adjusted to selectable charnels on a wavelength grid, and to re-configurable optical communications networks.

2. Description of the Related Art

The telecommunications network serving the United States and the rest of the world is presently evolving from analog to digital transmission with ever increasing bandwidth requirements. Optical fiber has proved to be a valuable tool, replacing copper cable in nearly every application from large trunks to subscriber distribution plants. Optical fiber is capable of carrying much more information than copper with lower attenuation.

Currently expansion of bandwidth in fiber optic networks is being accomplished by what is known as "wavelength division multiplexing" (WDM), in which modulation techniques are used to handle separate subscriber/data sessions concurrently on a single optical fiber. Current International Telecommunications Union (ITU) specifications call for channel separations of approximately 50 GHz. The ITU grid typically refers to those frequencies centered about approximately 1550 nm (e.g. approximately 1525 µm to 1575 nm for the C band). At those wavelengths, 50 GHz channel spacing corresponds to a wavelength separation of approximately 0.4 nm. In WDM applications, each subscriber datastream is optically modulated onto the output beam of a corresponding semiconductor laser. The modulated information from each of the semiconductor lasers is then combined onto a single optical fiber for transmission.

One type of laser presently used for fiber optic communications is a distributed-feedback (DFB) diode laser. In a system employing such a DFB laser, the wavelength grid may be defined by the transmission peaks of a reference etalon. Such a system would typically use a combination of the DFB laser and the reference etalon in a feedback control loop. DFB lasers suffer from the drawback that they have small tuning ranges of ~3 nm (See, e.g., J. Carroll, J. Whiteaway, & D. Plumb, *Distributed feedback semiconductor lasers*, SPIE Press, 1998). DFB laser transmitters must be individually sorted and each laser is usable for only one channel or a small number of adjacent channels.

On the other hand, WDM networks are evolving towards re-configurable architectures in which each transmitter's wavelength must be re-selectable on command. Re-configurable networks offer significant capacity, reliability, and management advantages over static systems (See, e.g., R. Ramaswami and K. Sivarajan, *Optical Networks. A Practical Perspective*, Morgan Kaufmann Publishers, 1998).

SUMMARY OF THE INVENTION

The present invention provides a tunable laser with a compact form factor and precise tuning to any selected center wavelength of a selected wavelength grid. The laser may thus be utilized in telecommunications applications to generate the center wavelength for any channel on the ITU or other wavelength grid. The laser utilizes a feedback loop for control. A novel tuning method and apparatus is disclosed which includes a tuning element in a cavity of the laser and a feedback circuit working with an optical passband defined in the path of an optical beam. The tuning element may adjust the optical path length of the cavity with respect to the passband.

The feedback circuit modulates the optical path length of the cavity. The feedback circuit utilizes phase differences between the modulation signal and the resultant intensity variations of the optical beam to adjust the intensity variations in the optical beam thereby maintaining alignment of a cavity mode with the center wavelength of the passband. Additionally, with a proper selection of modulation frequency and amplitude, the line width of the optical beam emitted by the laser is effectively broadened. The feedback system senses a system response to the applied wavelength modulation signal. The magnitude of the response and its phase with respect to the applied modulation signal are detected and an error signal is produced. The size and sign of the error signal are indicative of the amount and direction of correction, respectively, that need to be made by the feedback system to the optical path length of the cavity.

In practice, the feedback system (or servo system) may be tuned to null the error signal or to drive it to a selected voltage. With proper selection of the optical elements and wavelength tuning mechanism, the feedback system can actively stabilize the laser output and "lock" the emitted wavelength to a chosen value. Additionally, the frequency range of the wavelength modulation may be manipulated to control the coherence length of the emitted beam, thereby mitigating deleterious non-linear effects, particularly Stimulated Brillouin Scattering (SBS), that can arise in the propagation of laser light in optical fibers.

BRIEF DESCRIPTION OF THE DRAWINGS

These and other features of the invention will become more apparent to those skilled in the art from the following detailed description in conjunction with the appended drawings in which:

FIGS. 3A–B are software block diagrams of the controller for the tunable laser including the tuning circuit.

DETAILED DESCRIPTION

Figure 1:
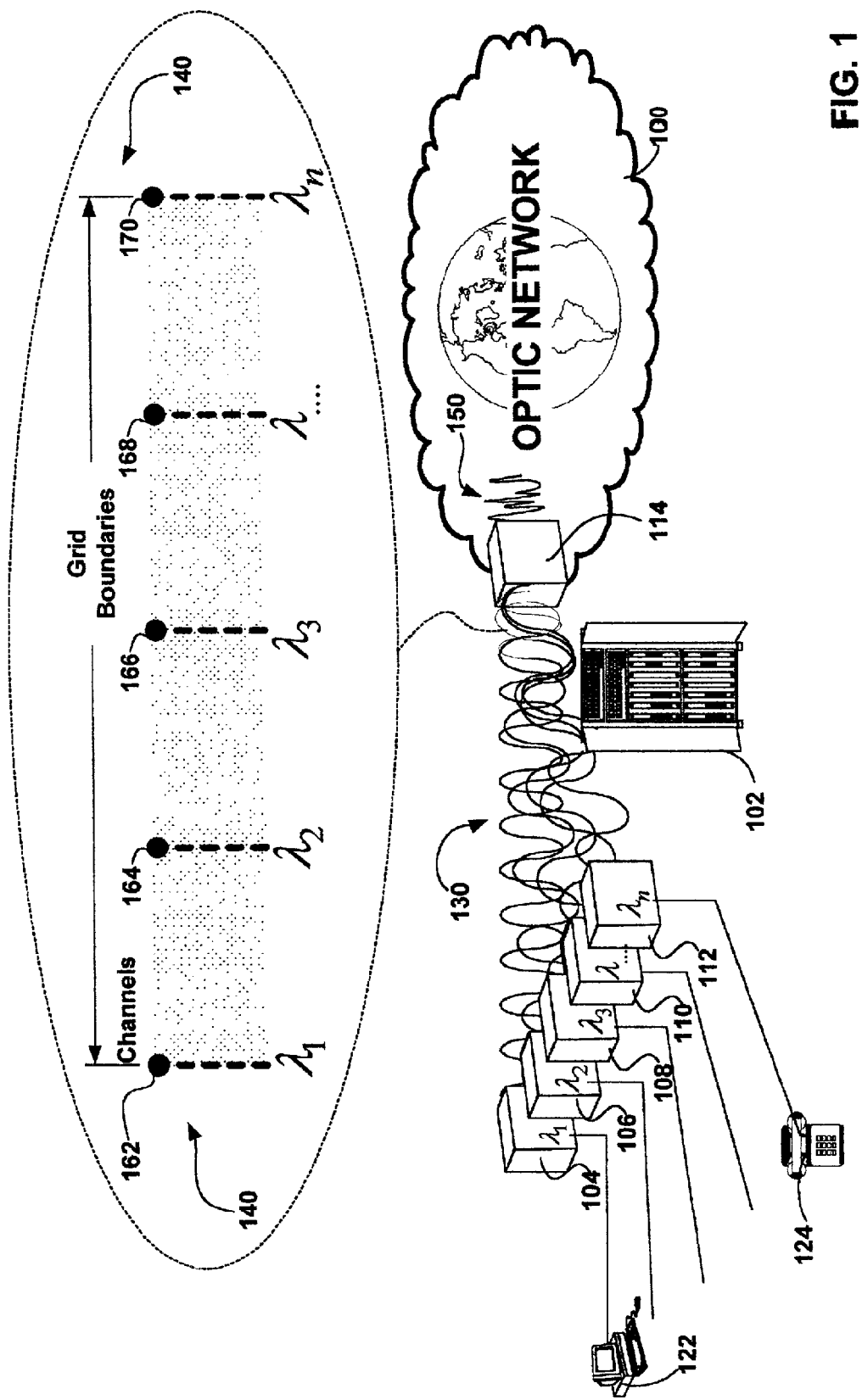
FIG. 1 shows a telecommunications network incorporating lasers tunable to the center frequency of any of the WDM channels on the optical network.

FIG. 1 shows an overall system environment with a plurality of I/O devices 122–124 communicating across an optical network 100 via a central office 102 or other access point. The central office includes apparatus for handling wavelength division multiplexing (WDM) of the communications to/from the various I/O devices. On the transmit side, a plurality of wavelength lasers 104–112 each provide a carrier wavelength on which each corresponding information channel 162–170 is modulated. The wavelength grid 140 defined by the ITU or other standards setting body sets the required center wavelength and related parameters for each of the channels. The data streams carried by a number of channels are multiplexed optically or electrically with multiplexer 114 and placed on the optical network, comprised of optical fibers and associated optical infrastructure. The multiplexer 114 is an optical device which combines various wavelengths (or channels) on respective optical paths into one multi-channel optical signal depending on the propagation direction of the light.

In the transmit mode, each of a bank of lasers e.g. 104–112 radiates light at one of the selected center frequencies/wavelength of each channel of the telecommunications grid. As mentioned above, the ITU C-band spans wavelengths from approximately 1525 to 1575 nm. Several channel spacing standards are in use for example, one currently referred to as Dense Wavelength Division Multiplexing (DWDM) employs 50 GHz spacing between adjacent channels. This spacing corresponds, at wavelengths near 1550 nm, to a wavelength separation of approximately 0.4 nm. Each subscriber data stream is optically modulated onto the output beam of a corresponding laser. A framer (not shown) provides framing, pointer generation and scrambling for transmission of data from the bank of lasers and associated drivers. The modulated information 130 from each of the lasers is passed into the multiplexer 114. The output 150 of the multiplexer 114 is coupled into an optical fiber for transmission.

FIGS. 2A–F are isometric views of various embodiments of a tunable laser in accordance with the current invention. Each laser includes at least one tunable element that generates at least one wavelength passband. The passband(s) may correspond with a channel of a telecommunications wavelength grid for example. Each laser also includes a system for modulation of the optical path length of the laser cavity and detection of resulting intensity variations. In the FIGURES accompanying this description, like reference numbers refer to like elements.

Figure 2A:
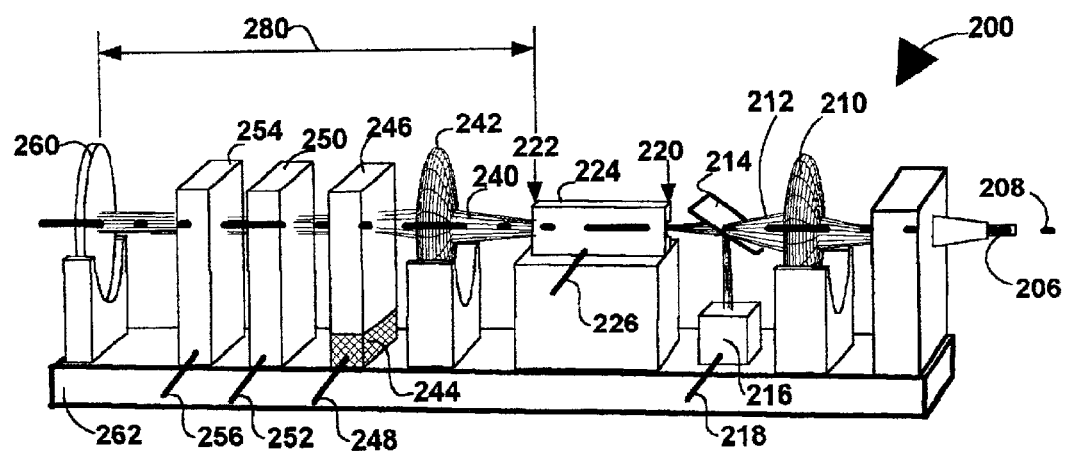
FIGS. 2A–E are isometric views of various embodiments of a tunable laser in accordance with the current invention.

In FIG. 2A the laser 200 includes: a gain medium 224, a resonant cavity 280 optically coupled to the gain medium and various control lines for coupling to a controller (See FIGS. 3A–B). In FIGS. 2A–F, the laser 200 shown may be referred to as an external cavity laser. However, the present invention is in no way limited to use with external cavity lasers. The laser 200 is shown coupled to an optical fiber 206. Structurally, the laser 200 is shown laid out along an optical path 208. The laser includes a gain medium 224. The gain medium may be implemented as a laser diode. Other gain mediums could be utilized such as a semiconductor optical amplifier, angled facet laser diodes, bent or tapered wave-guide, etc. In FIG. 2A, the front and rear facets 222–220 of the laser diode are aligned with the optical path 208. The proximal end of the resonant cavity 280 is located at the front facet 222 of the laser diode. The retro reflector 260 dies the distal end of the resonant cavity 280. Coupling optics 210 are positioned between the rear facet 220 of the gain medium 224 and the optical fiber 206. The rear facet of the gain medium 224 is partially reflective thereby allowing an output beam 212 to exit from the back of the gain medium 224. The output beam 212 is coupled to a photo detector 216 via a beam splitter 214 as well as to the optical fiber 206 via lens 210. Providing an output beam from the back facet of the gain medium has the added benefit of providing lower relative source spontaneous emission since the output beam makes a complete pass through all optics in the system. In the configuration shown in FIG. 2A the retro reflector 260 is totally reflective. In other configurations of the invention retro reflector 260 may be partially reflective so as to emit an output beam for coupling to an optical fiber or other optical element. In addition, in such a configuration it is possible to monitor intensity variations in the optical beam through a partially reflective retro reflector 260.

The front facet 222 of the gain medium may have an AR coating with a reflectivity of less than 0.5% to allow optical feedback from the various elements within the resonant cavity 280. Lens 242 collimates/focuses the output 240 of the gain medium onto the components of the cavity 280.

The grid generator 246 is the first of the tuning elements within the resonant cavity 280. The grid generator 246 optically couples with the gain medium 224, to allow feedback thereto. The grid generator 246 exhibits periodic passbands (See FIG. 4A) that align with the gridlines of the selected wavelength grid. The grid generator may be implemented as a Fabry-Perot filter, e.g. a parallel-plate etalon with reflecting surfaces separated by a gas or solid spacer. The grid generator 246 may alternatively be implemented as a Fabry-Perot filter, a diffraction element, an interference element or a birefringent element. When implemented as an etalon, the grid generator 246 has a thickness L and an index of refraction $n_g$ that define a free spectral range ($FSR_{Grid_{Gen}}$) via the relation:

$$FSR_{Grid\_Gen} = c/(2n_g L).$$

The free spectral range of the grid generator is chosen such that its transmission spectrum comprises a multiplicity of maxima within the communications band at wavelengths that coincide with the center wavelengths of the selected wavelength grid, 140(See FIG. 1).

More generally, the grid generator 246 results in a plurality of passbands centered on each of the gridlines of the selected wavelength grid. The grid generator 246 has an attenuation profile that suppresses neighboring modes of the laser between each channel. The grid generator 246 may be provided with a temperature controller or other grid generator control element 244 that maintains the passbands in alignment with the wavelength grid. The grid generator control element 244 couples with the controller (See FIGS. 3A–B) via signal line 248.

The second of the tuning elements within the resonant cavity 280 is the channel selector 250 that optically couples with the gain medium 224 as well. The channel selector 250 serves to attenuate all but the selected one(s) of the passbands generated by the grid generator 246 within the selected wavelength grid (See FIG. 4B–C). The channel selector 250 may be implemented: as a narrow-band "vernier" filter (See FIG. 4C), as a broadband periodic filter (See FIG. 4A), or as a passband filter for example. The channel selector 250 couples with associated control circuit (See FIGS. 3A–B) via signal line 252. The channel selector 250 may alternately be implemented as a Fabry-Perot filter, a diffraction element, an interference element or a birefringent element. The tuning of the channel selector 250 nay be achieved in a variety of ways including mechanical, thermal and electro-optical. The finesse of the grid generator 246 and channel selector 250 are chosen to suppress channels adjacent to the selected channel(s). The tuning of the channel selector may be brought about by changes in its optical path length, i.e. its length or refractive index. These may be brought about electrically, thermally, or electro-optically.

The laser 200 has a number of lasing modes the spacing of which corresponds to an integer multiple of half wavelengths of the total optical path length of the laser 200, that is, of the gain medium and the resonant cavity 280 (ie. $L_{optical\ path} = N(\lambda/2)$). The alignment of those modes with the wavelength grid generated by the grid generator 246 and the specific passband within that grid selected by the channel selector 250 will vary throughout the operation of the device. Subtle changes in temperature, humidity, voltage, current etc. all may effect the long-term stability of the device. This can result in misalignment of the lasing modes to the wavelength grid as well other negative effects, e.g. decreased laser power being coupled to the optical fiber.

In the embodiment of FIG. 2A, a tuning circuit continuously tunes the laser to correct for any such misalignment of the modes and the wavelength grid. The grid generator 246 and the channel selector 250 effectively work together to perform "macro" tuning to a selected wavelength or passband(s). Additionally, the tuning mechanism of FIG. 2A includes functionality to i) modulate the optical path length of the laser 200, and ii) adjust the optical path length of the laser 200. In the configuration shown in FIG. 2A, these functions are implemented in a single electro-optically activated element 254.

More specifically, element 254 accomplishes both the function of an optical path length modulator for modulating the optical path length of the laser 200 and the function of an optical path length adjuster for adjusting the optical path length of the laser 200. The modulation of the optical path length of the laser 200 produces intensity variations in the laser beam as discussed in connection with FIGS. 5A–C. These intensity variations decease in magnitude and phase error as a cavity mode is brought into alignment with the center wavelength of the passband(s) generated by the grid generator 246 and channel selector 250. This latter alignment is accomplished through function ii) identified above, i.e. adjusting the optical path length. Although the optical path length adjusting and modulating functions are performed in a single element 254 in the laser illustrated in FIG. 2A, such functions may be performed using separate elements. In addition, it may be possible to combine element 254 with another element, such as the retro reflector 260. For example, it is possible to utilize a lithium niobate crystal with a reflective coating on the distal end of the crystal to provide the functions of elements 254 and 260. In such a configuration, as mentioned above, it is also possible to have a partially reflective coating on the distal end of such a crystal to monitor intensity variations in the optical beam.

The electro-optically activated component 254 of FIG. 2A may be, for example, a solid or gas spaced etalon which is electro-optically, acousto-optically, mechanically, or thermally modulated with a modulation signal to accomplish the path length modulation function. To accomplish optical path length adjustment an offset signal (an optical path length adjustment signal) can be added to the modulation signal. The combined modulation signal and optical path length adjustment signal may be provided via signal line 256 from controller 300 (See FIGS. 3A–B). Alternately, the offset signal may be sent separately to a path-length adjustment element. A broad range of optical elements may accomplish the optical path length modulation and adjustment, including: a variable Fabry-Perot filter, a diffraction element, an interference element or a birefringent element. A voltage/current activated liquid-crystal cell or an electro-optic element such as a lithium niobate crystal may also be utilized.

The modulation of the optical path length (and hence, of the laser wavelength) may also have the beneficial effect of reducing the coherence length of the emitted beam. Through proper choice of modulation frequency and amplitude, the coherence length can be reduced in a manner designed to effectively increase the coupling efficiency of the laser with an optical fiber by increasing the threshold power for non-linear effects within the fiber. For example, this wavelength modulation effectively shortens the interaction length of the laser radiation with the fiber, thereby inhibiting SBS.

Figure 2B:
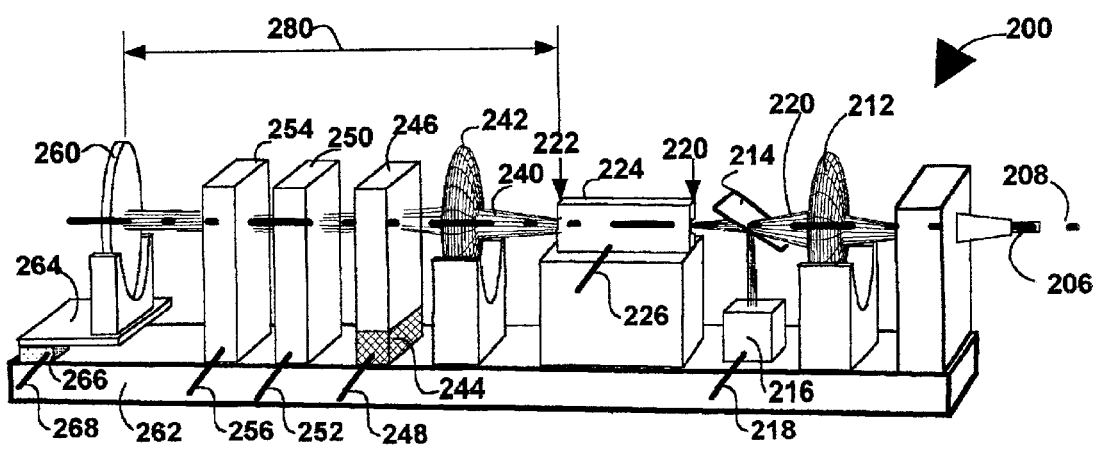

FIG. 2B shows another configuration of the tunable laser 200 in which the optical path length modulation and adjustment functions are implemented as separate elements. In this configuration element 254 continues to serve as the optical path length modulator. The retro reflector 260 performs the optical path length adjustment function. An actuator 266 couples the retro reflector 260 to the base 262 via a platform 264. Under the control of the tuning circuit (See FIGS. 3A–B) a signal is delivered to the actuator 266 that causes an adjustment of the retro reflector 260 along the optical axis 208. This has the effect of decreasing or increasing the optical path length of the laser 200 to center a cavity mode in the passband(s) provided through the use of the grid generator 246 and selector 250. The actuator 266 may be implemented as a thermal expansion member, a mechanical actuator such as a piezo electric element, a voice coil actuator, or any other suitable actuator capable of finely controlled movement of the platform 264.

Figure 2C:
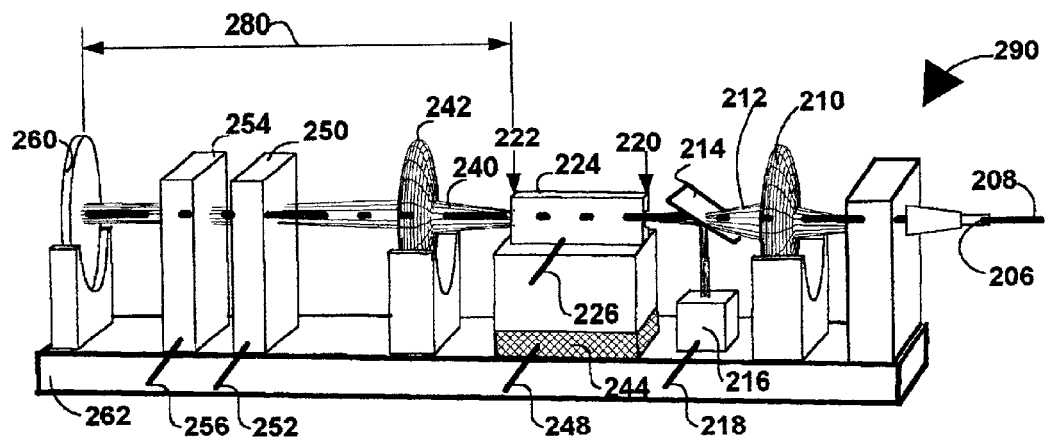
Figure 2D:
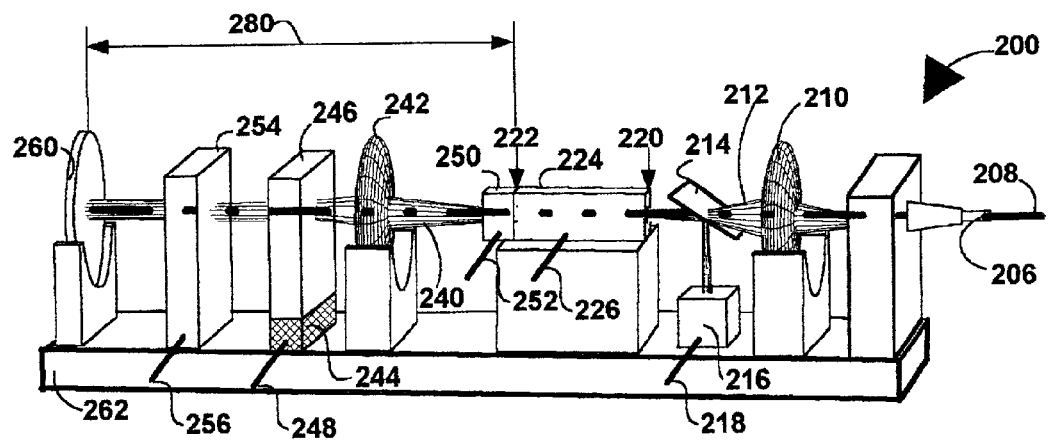

FIGS. 2C–D illustrate laser configurations in which the grid generator (FIG. 2C) or the channel selector (FIG. 2D) are implemented integral with the gain medium 224. In FIG. 2C the front 222 and rear 220 facets of the gain medium 224 serve as a Fabry-Perot element from which the grid generator function is implemented. The front facet retains sufficient reflectivity to serve as a partially reflective etalon boundary without fully degrading its acceptance of optical feedback from the resonant cavity 280.

FIG. 2D illustrates the implementation of the channel selector 250 together with the gain medium 224. A voltage applied via signal line 252 may be used to modulate the refractive index of a semiconductor layer integral with the front facet 222 of the gain medium 224, thereby tuning the passbands generated by the channel selector 250 to the selected channel(s) generated by the grid generator 246.

In each of the lasers illustrated in FIGS. 2C and 2D, it is possible to utilize element 254 to perform the functions of modulating and adjusting the optical path length of the laser. Alternatively, the functions of modulating and adjusting the optical path length can be split as shown in FIG. 2B.

Figure 2E:
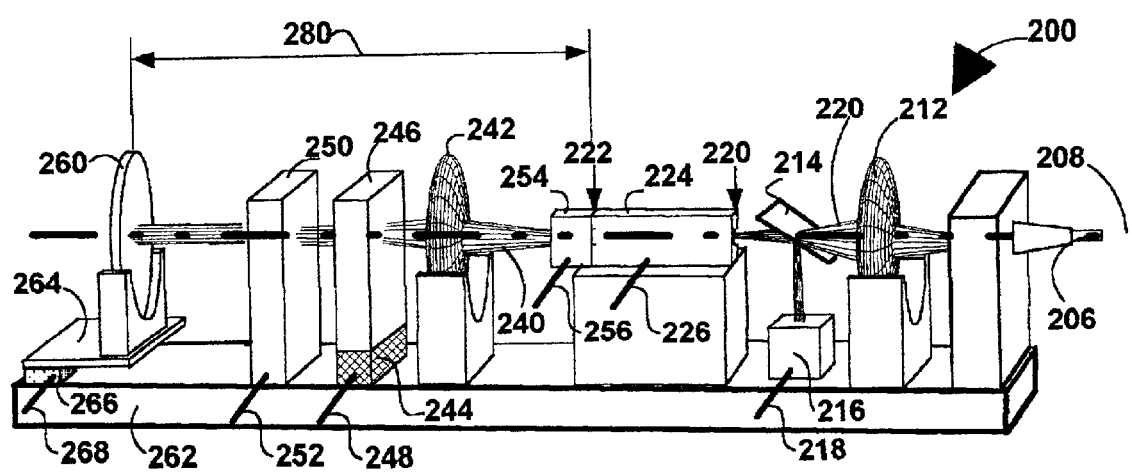

In FIG. 2E the optical path length modulator function of element 254 is implemented integral with the gain medium 224. A voltage applied via signal line 256 may be used to modulate the refractive index of a semiconductor layer integral with the front facet 222 of the gain medium, thereby modulating the optical path length of the laser 200. As with the lasers of FIGS. 2C and 2D, the laser of FIG. 2E may also be modified in a similar manner. To reduce spurious feedback to the gain medium, either or both of the grid generator and the channel selector may be tilted. Alternately or in addition, a polarization selective filter may be added to the cavity to reduce spurious feedback to the gain medium. Such a system may employ quarter wave plates positioned on either side of the grid generator and channel selector. Since the output beam of the laser is polarized, the quarter wave plates block the return of light to the gain medium that has not made a dual pass through both the grid generator and channel selector. In either configuration, the close proximity of the components and fiber allows integration of these components into a highly-stable opto-mechanical subsystem that can be hermetically sealed, thus enhancing tolerance to ambient temperature, shock, and vibration FIGS. 3A–B are block diagrams of the controller 300 for the tunable laser including the tuning circuit. The controller 300 includes a tuning circuit 310, a current/voltage driver 302, a grid controller 304 and a channel controller 306. The current/voltage 302 driver controls the power delivered via line 226 to the gain medium 224. The grid controller 304 maintains the referential integrity of the grid generator 246 using, for example, a temperature control element 244 which is thermally coupled to the grid generator and driven via signal line 248. The channel controller uses electrical, mechanical, thermal or other means to tune the channel selector 250 to which it is coupled via signal line 252. The tuning circuit 310 includes a signal detector 312, a signal processor 314, an optional low pass filter 316, an error corrector 318, a path length adjuster 320, a modulation signal generator 322, and the I/O components i.e., the signal detector 216, and the respective elements for performing optical path length modulation and adjustment 254 (See e.g., element 254 in FIG. 2A). The modulation signal generator 322 provides a modulation signal to the appropriate element (e.g. 254) that in turn causes modulation of the optical path length. The modulation frequency and amplitude may be selected to increase effective coupling efficiency as well e.g., by mitigating SBS. The signal detector 216, which may be a photodiode or any other suitable detector, monitors the intensity variations in the optical beam 212 brought about by the modulation of the optical path length by the modulator 254. The intensity signal from signal detector 216 provides input to the signal processing circuitry 314. The signal processing circuitry 314 also accepts as reference a modulation signal from the modulation signal generator 310. The signal processing circuitry determines the alignment of a laser mode with the passband peak using any of a number of signal processing techniques. In one embodiment of the invention the signal processing involves phase-synchronous detection to determine the phase relationship between the modulation signal and the intensity signal from detector 216. The relative phase between the signals is then passed to the error corrector 318 with or without low pass filtering performed by filter 316. This phase-synchronous detector 314 may be implemented as a phase-locked loop. In another embodiment of the invention the signal processing circuitry monitors intensity variations and frequency of the intensity signal from detector 216 to determine when intensity variations are minimized. As is explained in greater detail in FIGS. 5A–C intensity variations are minimized and the frequency of the intensity signal is increased when a laser mode is aligned with the passband peak. In still another embodiment of the invention, the signal processing circuit 314 may additionally be responsive to selected harmonics of the modulation frequency provided by the signal detector 216.

The error corrector 318 generates an error correction signal that causes the path length adjuster 320 to adjust the optical path length so as to optimize the relationship between the modulation signal and the intensity signal or drive that relationship to a chosen offset. When a cavity mode is aligned with one of the passband(s) generated by the tuning elements, intensity variations at the modulation frequency and odd multiples thereof in the optical beam are substantially minimized (See FIG. 5C). Concurrently the intensity variations at twice the modulation frequency and other even multiples thereof are enhanced. (See FIG. 5C). Any one or combination of these effects may be used to indicate that the laser wavelength is properly centered on the selected channel (i.e. the relationship between the modulation signal and the intensity signal is optimized).

FIG. 3A illustrates the case where a signal is used to drive a combined optical path length modulator and adjuster such as that shown in FIG. 2A. The path length adjuster 340 provides the "DC" offset needed to center a mode of the cavity on the passband(s) created by the tuning elements which is combined with the modulation signal provided by the modulation signal generator 322 to provide the appropriate "AC" signal on line 256. The terms "AC/DC" are used for illustrative purposes only. Actually the error correction signal that drives adjustment of the path length is also a time variant signal FIG. 3B illustrates the case where the optical pa length adjustment and modulation are performed by separate elements. In such a case, the path length adjuster 340 provides the appropriate drive signal for the path length adjuster, e.g. adjustable retro reflector 260, while the modulation signal generator 310 provides the modulation signal to drive the separate optical path length modulation element 254 (See FIG. 2B).

Figure 4B:
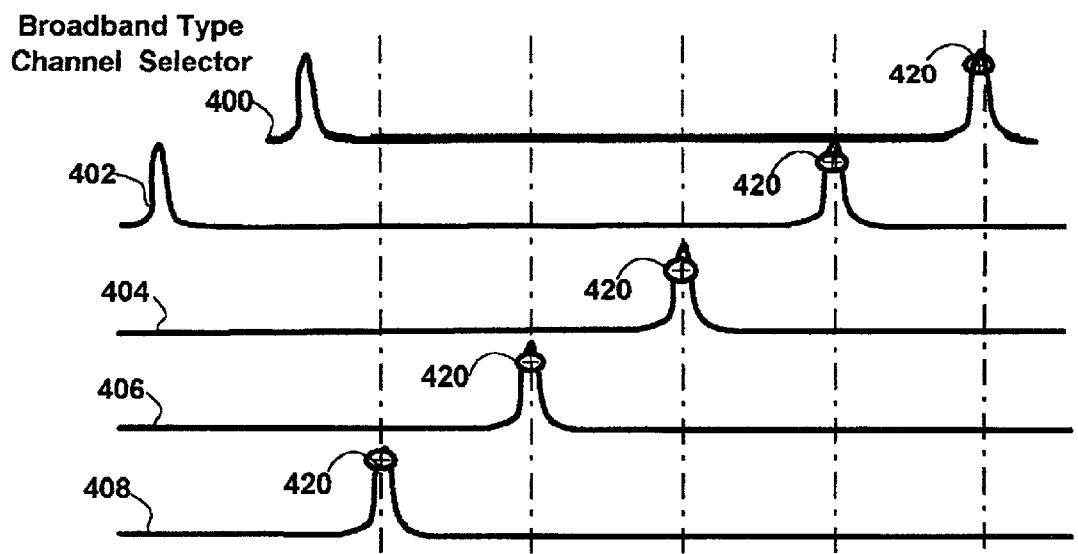
FIGS. 4A–C are graphs of intensity vs. wavelength showing the signal profiles associated with various tuning elements which may be utilized for generating one or more passbands within the tunable laser for channel selection.
Figure 4A:
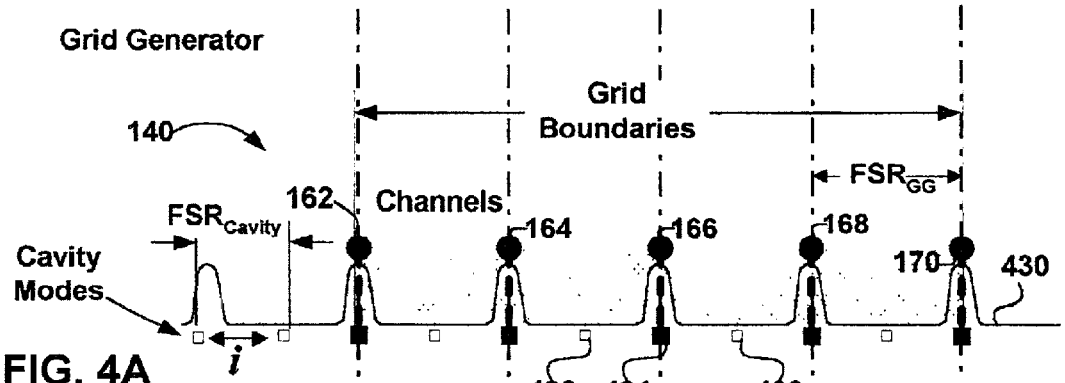
Figure 4C:
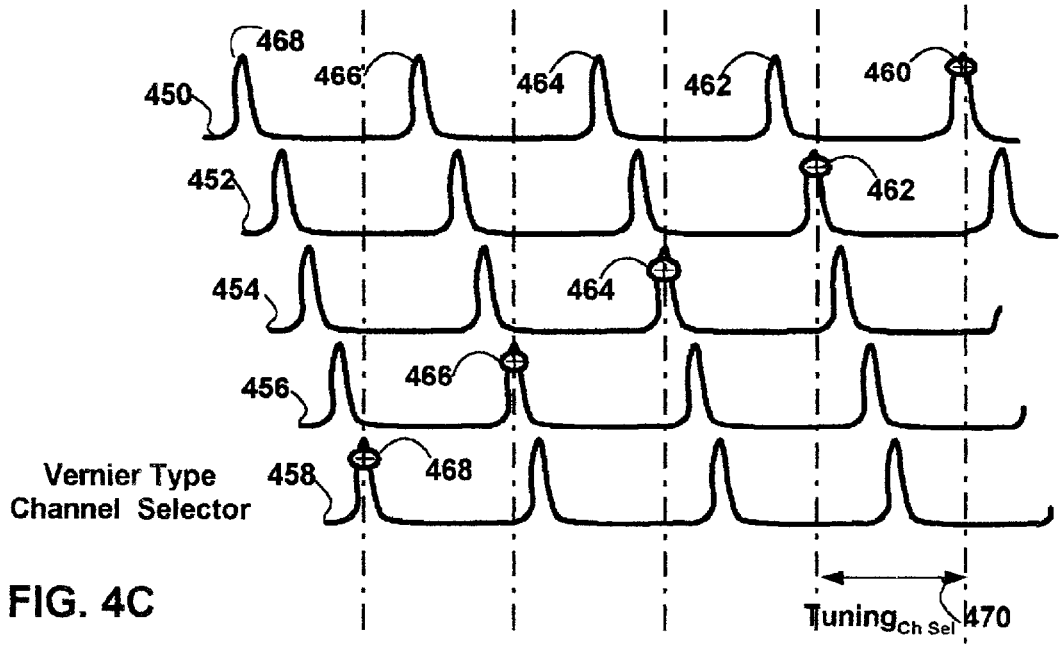

FIGS. 4A–C are graphs of intensity vs. wavelength showing the signal profiles associated with various tuning elements which may be utilized for generating one or more passbands within the resonant external cavity 280 for channel selection Specifically, FIG. 4A shows the periodic passbands 162–170 generated by the grid generator 246 (See FIG. 2A). FIGS. 4B–C show broadband and vernier channel selector passband profiles respectively that may be used in combination with the grid generator to select passband(s) generated by the grid generator.

A periodic waveform 430 with 5 passbands 162–170 within the wavelength grid 140 are shown in FIG. 4A. Lasing will occur within each passband at one or more of the cavity modes that aligns with the associated passband. Cavity modes 432–436 are also shown in FIG. 4A. The relationship between the passbands provided by the grid generator and the cavity are expressed in the following Equation 1:

$$FSR_{GridGen} \approx i \cdot FSR_{Cavity} \qquad \text{Equation 1}$$

where i is an integer.

Equation 2 expresses the FSR of the grid generator as a function of the optical path length of the grid generator and the spacing between channels in the chosen wavelength grid:

$$FSR_{GridGen} = \left(\frac{1}{2}\right)\frac{c}{n_g \cdot L_g} \approx \text{Channel\_Spacing} \qquad \text{Equation 2}$$

where c is the speed of light in vacuum, $n_g$ is the refractive index of the grid generator and $L_g$ is the physical length along the optical path of the grid generator.

Equation 3 expresses the FSR of the overall cavity as a function of channel spacing:

$$FSR_{Cavity} = \left(\frac{1}{2}\right)\frac{c}{\sum n_i \cdot L_i} \approx \frac{\text{Channel\_Spacing}}{i} \qquad \text{Equation 3}$$

where i is an integer series corresponding to each element, lens, gain medium, etalons, gratings, etc. and including air/gas within the combined internal and external cavities and $n_i$ is the refractive index of the $i_{th}$ element in the cavities and $L_i$ is the length along the optical path of the $i_{th}$ element in the cavity.

When the grid generator and channel selector are optically coupled in an optical cavity of a laser to provide allow feedback to the gain medium, the following relationship is attained. The grid generator selects periodic longitudinal modes of the cavity at intervals corresponding to the channel spacing and rejects neighboring modes. The channel selector selects one or more channels within the wavelength grid and rejects other channels.

The finesse of each filter determines the attenuation of its nearest neighboring modes or channels. Finesse is expressed in the following Equation 4 as the ratio of the separation of adjacent maxima to the half-width of the passband.

Finesse=$FSR/\Delta\upsilon$  Equation 4 where $\Delta\upsilon$ is the passband halfwidth.

FIG. 4B shows the effect of the passband created by channel selector 250 upon an incident beam during the selection of each of the channels in the wavelength grid. When the feedback to the gain medium 224 transmitted by the channel selector 250 in response to the incident beam is further filtered by the grid generator 246, a combined passband results that corresponds with a channel of the wavelength grid. The tuning range 430 for the channel selector 250 is such that it is capable of selecting passbands across the wavelength grid, such as 162–170 shown in FIG. 4A. The channel selector 250 is shown at tuning positions 400–408 selecting each of the passbands 170, 168, 166, 164, and 162 respectively generated by the grid generator 246 utilizing passband 420.

The FSR of channel selector 250 shown in FIG. 4B may be a function of the optical path length of the channel selector and the bandwidth of the wavelength grid as shown in the following Equation 5:

$$FSR_{ChanSel} = \left(\frac{1}{2}\right)\frac{c}{n_s \cdot L_s} \geq \approx \#Channels \cdot FSR_{GridGen}$$  Equation 5 where $n_s$ is the refractive index of the channel selector and $L_s$ is the physical length along the optical path of the channel selector. The FSR of the channel selector 250 is chosen to suppress oscillation outside the passband across the gain profile of the gain medium or optical beam source. An additional fixed bandpass filter may be employed to reduce the suppression required of the channel selector 250 to just the wavelength range of the grid, i.e. the number of channels*channel spacing.

FIG. 4C shows the passband generated by a channel selector 250 during the selection of each of the channels in the wavelength grid. When transmission maxima from channel selector 250 and grid generator 246 coincide, one or more passbands are created which correspond with one or more channels within the wavelength grid. The tuning range 470 for the channel selector 250 is less than or substantially equal to the channel spacing within the wavelength grid. The channel selector 250 is shown at tuning positions 450–458 selecting each of the passbands 170, 168, 166, 164, and 162 respectively generated by the grid generator by means of passbands 460–468 respectively. The tuning the channel selector 250 in this example exhibits a plurality of passbands, e.g. 460–468, within the wavelength grid. The number of passbands generated by the channel selector within the wavelength grid may be greater or less than the number of passbands created by the grid generator.

In a laser 200 of the present invention, the cavity length will vary with temperature and other variables. The periodic peaks, i.e. passbands created by the grid generator and channel selector in combination, will typically not coincide with a cavity mode. As discussed above, the tuning circuit of the current invention is designed to correct this by fine-tuning the optical path length of the laser to move cavity modes into alignment with the passbands.

Figure 5C:
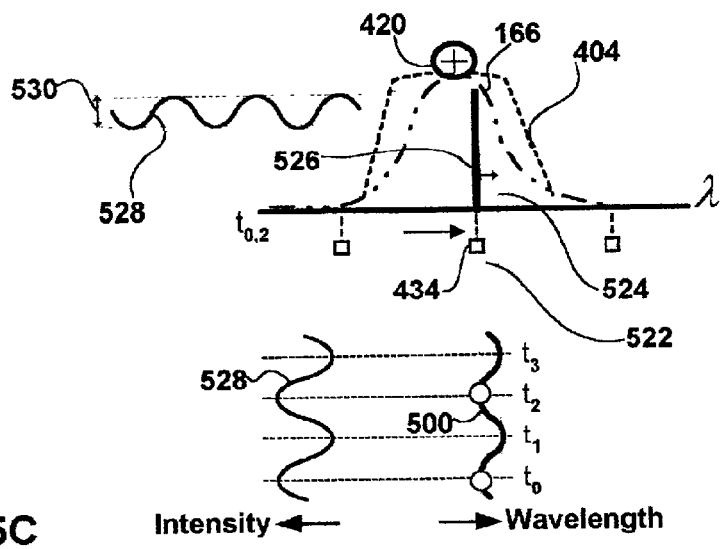
FIGS. 5A–C are exploded views of the graphs of intensity vs. wavelength with exploded views of the signal profiles shown in FIGS. 4A–B showing the modulation signal that is injected into the optical beam for purposes of tuning the optical path length of the cavity to align with the passband generated by the tuning element.
Figure 5B:
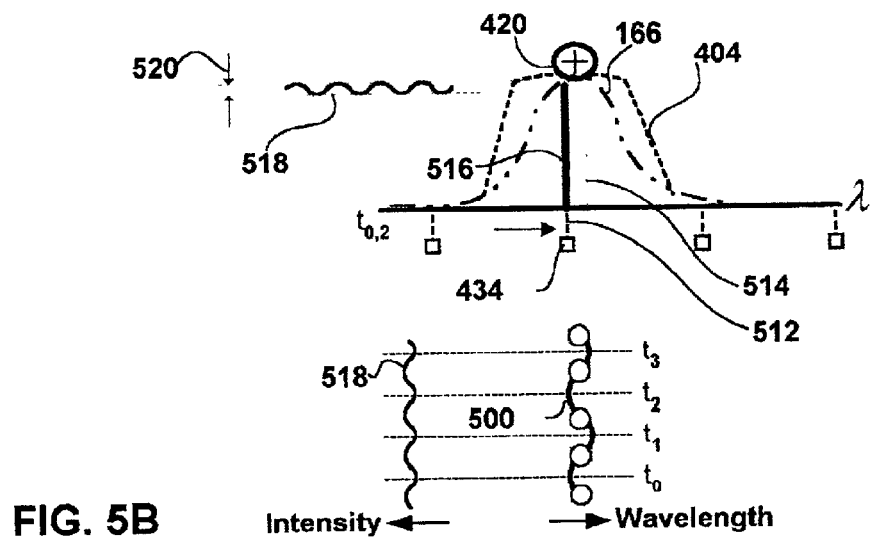
Figure 5A:
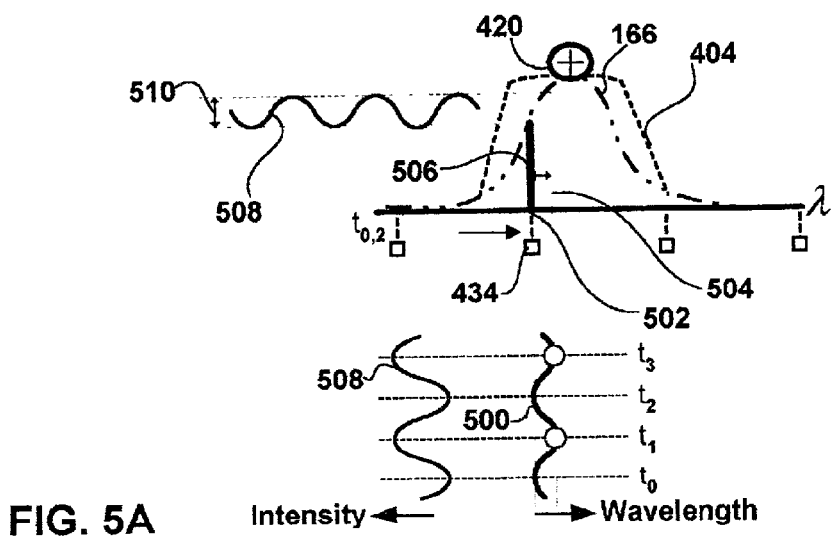

FIGS. 5A–C are expanded views of the graphs of intensity vs. wavelength with magnified views of the signal profiles shown in FIGS. 4A–B. The modulation signal that is used to modulate the optical path length of the laser 200 (See FIGS. 2A–E) is shown in various phase relationships with the resulting intensity signal. Tuning of the laser 200 is used to compensate for misalignment between a mode of the laser within the selected passband and the center wavelength of the selected passband.

In the example shown in FIG. 5A the modulation signal 500, the laser output line width 506, and the resultant intensity variations in the magnitude of the line width, i.e. the intensity signal 508 are shown. In FIG. 5A mode 434 is modulated over a wavelength range 502–504 centered about a shorter wavelength than the wavelength associated with the passband peak 420. As the wavelength of the laser 200 is modulated, for example using the optical path length modulator function of element 254 (See FIGS. 2A–E), the intensity of the optical beam increases as the wavelength of the longitudinal modes increases. The modulation signal 500 and the resultant intensity signal 508 are in phase. The slope of the passband determines the magnitude 510 of the intensity signal 508 over the wavelength range 502–504 of the modulation signal. The greater the slope of the passband, the greater the magnitude of the intensity signal 508. At times $t_1$, $t_3$ the intensity signal reaches a peak magnitude. The dominant frequency of the intensity signal is equal to the frequency of the modulation signal.

In FIG. 5B mode 434 is modulated over a wavelength range 512–514 centered about passband peak 420. This corresponds with a wavelength lock position, at which the dominant frequency of the intensity signal 518 is double that of the modulation signal 500 and at which the magnitude of the variations in the intensity signal 518 are minimized. Both of these effects result from the modulation being performed about the center of the passband because in this situation the varying wavelength samples a region of the passband characterized by small slope and even symmetry about the center. As the optical path length of the resonant cavity is modulated by the optical path length modulator 254 (See FIGS. 2A–E) the intensity of the optical beam increases and decreases twice in each period of the modulation signal. Here, each zero crossing of the modulation signal coincides with a peak in the intensity signal. The peak to peak magnitude 520 of the intensity signal 518 is at a minimum since the period of the modulation signal occurs symmetrically on the peak of the passband over the wavelength range 512–514 of the modulation signal. The frequency of the dominant intensity signal in this instance is twice the frequency of the modulation signal.

In FIG. 5C mode 434 is modulated over a wavelength range 522–524 centered about a wavelength longer than the wavelength associated with the passband peak 420. As the optical path length of the laser 200 is modulated (See FIGS. 2A–E), the intensity of the optical beam decreases as the wavelength of the longitudinal modes increases. The modulation signal 500 and the resultant intensity signal 528 are thus 180 degrees out of phase. The slope of the passband determines the magnitude 530 of the intensity signal over the wavelength range 522–524 of the modulation signal. The greater the slope of the passband, the greater the magnitude of the intensity signal. At times $t_0$, $t_2$ the intensity signal reaches a peak magnitude. The frequency of the dominant intensity signal is equal to the frequency of the modulation signal.

The magnitude of the modulation signal 500 is selected so that during lock, the variation in output intensity is held to levels acceptable in the given application for the laser. The frequency of the modulation signal is chosen to be high enough to provide the required coherence control (e.g. for mitigation of SBS) yet not so high as to interfere with information modulated onto the carrier signal provided by each laser. It should be understood that by performing the comparison in FIGS. 5A–C of the modulation signal to the intensity variations caused thereby, the magnitude of the synchronous signal will provide an indication of how much the optical path length of the laser will need to be adjusted, while the phase difference (i.e. 0, 180°) of the resulting comparison will provide an indication in which direction to adjust the optical path length.

As those skilled in the art will readily appreciate, the above discussion of FIGS. 5A–C relates to detection of phase and intensity variations of the transmitted optical beam. It is also possible to perform the analysis discussed above on the reflected optical beam (e.g. the observed reflections from the grid generator), in which case the phase relationships discussed would be inverted. In addition, as those skilled in the would recognize, it is also possible to monitor variations in the optical beam from locations other than the output, e.g. of the retro reflector 260 as discussed above as well as at various other locations in laser 200.

Figure 6:
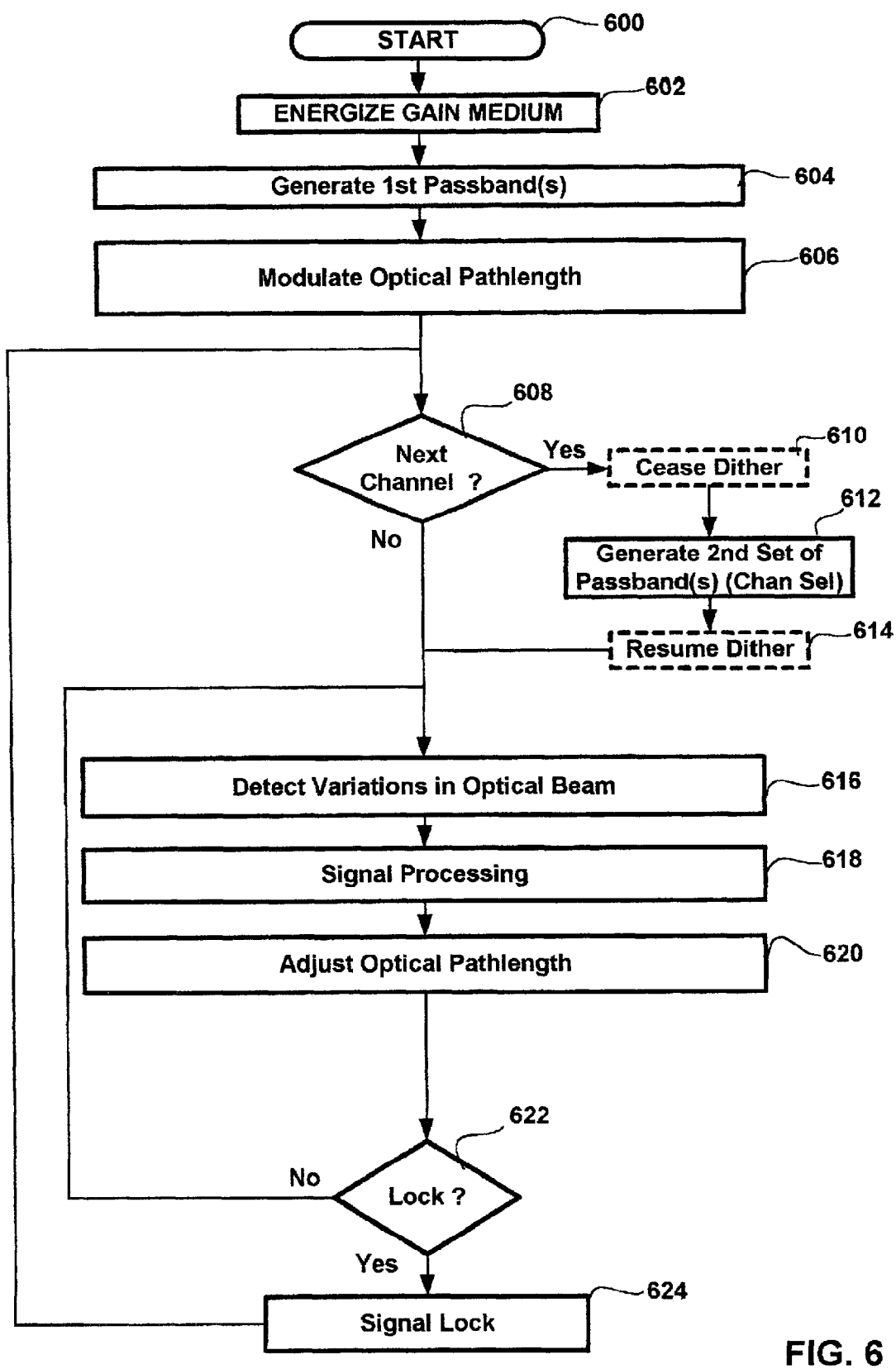
FIG. 6 is a process flow diagram showing steps associated with modulating a laser beam both to enable tuning of a tunable laser.

FIG. 6 is a process flow diagram showing steps associated with modulating an optical path length of a laser to tune the tunable laser and increase the coupling efficiency of the laser. After initialization in process 600 the gain medium is energized in process 602. Next in process 604 the grid generator filters an incident optical beam with a set of periodic passbands, i.e. a comb function, which corresponds with the wavelength grid 140 (See FIG. 1). Next in process 606 the modulating of the optical path length of the laser is initiated. Then in decision block 608, a determination is made as to whether tuning to another channel of the wavelength grid is to commence. If so, then control passes to optional process 610 in which modulation is interrupted while in process 612 the channel selector tunes the laser to a second set of passband(s). Feedback from the channel selector and the grid generator, as a result of the incident light beam, is combined to attenuate all but the selected passband(s) within the wavelength grid. Modulation of the optical path length of the laser is resumed in optional process 614. Control then passes to process 616 which is the same process reached directly from decision process 608 in the event no new channel is selected.

In process 616, variations in the optical beam are detected. Control then passes to process 618. In process 618 signal processing is performed. Signal processing may involve any of a number of signal processing techniques discussed above in connection with FIGS. 3A–B. These include phase-synchronous detection of the modulation signal and the intensity signal, or monitoring of the intensity signal alone as to amplitude and frequency. Then in process 620 a phase correction/error correction signal is generated. This signal, when applied by the optical path length adjuster discussed above, adjusts the optical pa length to align a given mode of the cavity and the center wavelength of the selected passband of the wavelength grid.

Next in decision process 622 a determination is made as to whether node lock has been achieved. An affirmative determination may be based on frequency doubling in the intensity signal or a minimization on in the variations in the intensity signal as discussed above in connection with FIG. 5B. If a lock condition is not detected control returns to process 616, and the process of adjustment continues until mode lock is achieved. Once a locked condition is detected in process 622, control passes to process 624 in which the lock is indicated and any communication is commenced or continued. Control then returns to decision process 608.

The foregoing description of a preferred embodiment of the invention has been presented for purposes of illustration and description. It is not intended to be exhaustive or to limit the invention to the precise forms disclosed. Obviously may modifications and variations will be apparent to practitioners skilled in this art. It is intended that the scope of the invention be defined by the following claims and their equivalents.

What is claimed is:

1. A laser comprising:
   a gain medium emitting an optical beam having a wavelength, the optical beam being emitted along an optical path in a resonant cavity;
   at least one tuning element optically coupled with the gain medium, the at least one tuning element defining at least one passband in the optical path of the optical beam; and
   a tuning circuit optically coupled with the gain medium and the at least one tuning element, the tuning circuit effecting modulation of an optical path length of the laser, detecting intensity variations in the optical beam resulting from the modulation, and adjusting the optical path length to adjust the wavelength of the optical beam in accordance with a relationship between the modulation and the detected intensity variations, wherein at least one of a frequency and an amplitude of the modulating of the tuning circuit is selected to increase the coupling efficiency of the optical beam with a communication medium by spreading a line width of the optical beam.

2. The laser of claim 1, wherein the tuning circuit further comprises:
   an optical path length modulator to modulate the optical path length with a modulation signal hereby generating intensity variations in the optical beam within that at least one passband; and
   an optical path length adjuster to adjust the optical path length to minimize the intensity variations in the optical beam resulting from the modulation signal.

3. The laser of claim 2, with at least one of the optical path length modulator and the optical path length adjuster as integral with the gain medium.

4. The laser of claim 2, wherein the optical path length modulator and the optical path length adjuster are integral with one another and responsive to the modulation signal to modulate the optical beam and responsive to an error correction signal to adjust the optical path length to minimize intensity variations in the optical beam.

5. The laser on claim 2, further comprising:
   a retro reflector defining a distal end of the resonant cavity, the optical path length adjuster being formed integral with the retro reflector to vary an optical path length of the laser to minimize the intensity variations in the optical beam.

6. The laser of claim 2, further comprising:
a detector to detect the intensity variations in the optical beam and to generate an intensity signal proportional thereto;
a phase detector to detect the phase error between the modulation signal and the intensity signal and to output an error signal corresponding thereto; and
the optical path length adjuster further responsive to the error signal to adjust the optical path length of the laser to minimize the intensity variations in the optical beam.

7. The laser of claim 6, with the phase detector further operable to detect the phase error between the modulation signal and the intensity signal at a selected harmonic.

8. A laser comprising:
a gain medium emitting an optical beam having a wavelength, the optical beam being emitted along an optical path in a resonant cavity;
at least one tuning element optically coupled with the gain medium, the at least one tuning element defining at least one passband in the optical path of the optical beam; and
a tuning circuit optically coupled with the gain medium and the at least one tuning element, the tuning circuit effecting modulation of an optical path length of the laser, detecting intensity variations in the optical beam resulting from the modulation, and adjusting the optical path length to adjust the wavelength of the optical beam in accordance with a relationship between the modulation and the detected intensity variations, wherein the at least one tuning element comprises at least one of:
a grid generator to generate a first set of passbands aligned with a center of wavelengths of a number of channels of a selected wavelength grid; and
a channel selector to select the channels to which to tune the optical beam by generation and tuning of at least a second passband with the first set of passbands.

9. The laser of claim 8, with at least one of the grid generator and the channel selector integral with the gain medium.

10. The tunable laser of claim 8, wherein the grid generator and the channel selector further comprise at least one of a Fabry-Perot filter, a diffraction element, an interference element and a birefringent element.

11. The tunable laser of claim 8, wherein the channel selector includes at least one of: a Pockels cell, a Kerr cell, a solid etalon, a gap etalon, a wedge-shaped solid etalon, a wedge-shaped gas etalon.

12. The tunable laser of claim 8, wherein the channel selector includes at least one of a tunable length and a tunable index of refraction.

13. The laser of claim 8, wherein the channel selector generates a second set of passbands within the selected wavelength grid and vernier tunes the second set of passbands with the first set of passbands to select the channels to which to tune the optical beam.

14. The tunable laser of claim 13, wherein the vernier tuning of the channel selector is effected by a selected one of: a mechanical actuator; a thermal actuator, an electro-optical actuator, and a pressure actuator to vernier tune the second set of passbands.

15. A method for tuning a laser comprising the acts of:
defining at least one passband in the optical beam in the resonant cavity;
modulating an optical path length of the laser;
detecting intensity variations in the optical beam within the at least one passband resulting from the modulating act; and
adjusting the optical path length of the laser to minimize the intensity variations detected in the detecting act, wherein the defining act further comprises:
filtering the optical beam to exhibit a first set of passbands substantially aligned with the corresponding channels of the selected wavelength grid; and
tuning the optical beam to at least a selected one of the first set of passbands.

16. The method of claim 15, wherein the tuning act further comprises the acts of:
filtering the optical beam to exhibit a second set of passbands within the wavelength grid; and
vernier tuning the second set of passbands with the first set of passbands to select channels at which to tune the optical beam emitted by the gain medium.

17. A method for tuning a laser comprising the acts of:
defining at least one passband in the optical beam in the resonant cavity;
modulating an optical path length of the laser at a frequency selected to increase a threshold for Stimulated Brillouin Scattering (SBS) in optical coupling of a gain medium with an optical fiber;
detecting intensity variations in the optical beam within the at least one passband resulting from the modulating act; and
adjusting the optical path length of the laser to minimize the intensity variations detected in the detecting act.

18. The method of claim 17, wherein the adjusting act further comprises the acts of:
detecting a phase error between the modulating in the act of modulating and the intensity variations detected in the act of detecting intensity variations; and
adjusting the optical path length of the resonant cavity to minimize the phase error.

19. The method of claim 18, with the act of detecting a phase error effected at a selected harmonic.

20. A laser comprising:
means for defining at least one passband in the optical beam in a resonant cavity;
means for modulating an optical path length of the resonant cavity;
means for detecting intensity variations in the optical beam within the at least one passband resulting from the modulating act; and
means for adjusting the optical path length of the resonant cavity to minimize the intensity variations detected in the detecting act wherein the means for defining further comprises:
means for filtering the optical beam to exhibit a first set of passbands substantially aligned with the corresponding channels of selected wavelength grid; and
means for tuning the optical beam to at least a selected one of the first set of passbands.

21. The laser of claim 20, wherein the means for tuning further comprises:
means for filtering the optical beam to exhibit a second set of passbands within the wavelength grid; and
means for vernier tuning the second set of passbands with the first set of passbands to select channels at which to tune the optical beam emitted by the gain medium.

22. A laser comprising:
means for defining at least one passband in the optical beam in a resonant cavity;
means for modulating an optical path length of the resonant cavity;

means for detecting intensity variations in the optical beam within the at least one passband resulting from the modulating act; and means for adjusting the optical path length of the resonant cavity to minimize the intensity variations detected in the detecting act, wherein the means for modulating further comprises means for modulating the optical path length at a frequency selected to increase the threshold for Stimulated Brillouin Scattering (SBS) in the optical coupling of the gain medium with an optical fiber.

23. The laser of claim 20, wherein the means for adjusting further comprises:

means for detecting a phase error between a modulating effected by the means for modulating and the intensity variations detected by the means for detecting; and means for adjusting the optical path length of the laser to minimize the phase error.

24. The laser of claim 23, with the means for detecting a phase error effected at a selected harmonic.

* * * * *

UNITED STATES PATENT AND TRADEMARK OFFICE
CERTIFICATE OF CORRECTION

PATENT NO. : 7,209,498 B1
APPLICATION NO. : 09/848914
DATED : April 24, 2007
INVENTOR(S) : Chapman et al.

It is certified that error appears in the above-identified patent and that said Letters Patent is hereby corrected as shown below:

In column 8, at line 21, delete "pa" and insert --path--.
In column 11, at line 65, delete "pa" and insert --path--.
In column 16, at line 1, delete "20" and insert --22--.

Signed and Sealed this

Twenty-ninth Day of April, 2008

JON W. DUDAS
*Director of the United States Patent and Trademark Office*